US007759660B2

(12) United States Patent
Yang (10) Patent No.: US 7,759,660 B2
(45) Date of Patent: Jul. 20, 2010

(54) ELECTRON BEAM LITHOGRAPHY SYSTEM

(75) Inventor: Baorui Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 293 days.

(21) Appl. No.: 11/646,787

(22) Filed: Dec. 28, 2006

(65) Prior Publication Data

US 2007/0102651 A1 May 10, 2007

Related U.S. Application Data

(62) Division of application No. 10/824,279, filed on Apr. 14, 2004, now Pat. No. 7,229,742.

(51) Int. Cl.
*H01J 37/20* (2006.01)
*H01L 21/68* (2006.01)
*G03F 7/20* (2006.01)

(52) U.S. Cl. .................. 250/492.23; 250/492.22; 430/296; 430/312; 430/328; 430/394; 430/942

(58) Field of Classification Search ............ 250/492.23; 310/12.06; 430/296, 312, 328, 394, 942
See application file for complete search history.

(56) References Cited

U.S. PATENT DOCUMENTS

| | | | |
|---|---|---|---|
| 4,532,598 A | | 7/1985 | Shibayama et al. |
| 5,334,282 A | * | 8/1994 | Nakayama et al. .......... 430/296 |
| 5,650,631 A | | 7/1997 | Sohda et al. |
| 5,760,410 A | | 6/1998 | Matsuki et al. |
| 5,847,402 A | * | 12/1998 | Nakasuji .................. 250/492.2 |
| 5,905,267 A | * | 5/1999 | Muraki ................... 250/492.22 |
| 6,259,106 B1 | | 7/2001 | Boegli et al. |
| 6,455,863 B1 | | 9/2002 | Babin et al. |
| 6,573,516 B2 | | 6/2003 | Kawakami |
| 6,605,811 B2 | | 8/2003 | Hotta et al. |
| 7,226,723 B2 | * | 6/2007 | Yang ......................... 430/296 |
| 7,229,742 B2 | * | 6/2007 | Yang ......................... 430/296 |

FOREIGN PATENT DOCUMENTS

| | | | | |
|---|---|---|---|---|
| JP | 59169131 A | * | 9/1984 | |
| JP | 61255022 A | * | 11/1986 | |
| JP | 09082630 A | * | 3/1997 | |

* cited by examiner

*Primary Examiner*—Jack I Berman
(74) *Attorney, Agent, or Firm*—Traskbritt (57) ABSTRACT

Methods to reduce the write time for forming mask patterns having angled and non-angled features using electron beam lithography are disclosed. In one exemplary embodiment, non-angled features of the mask pattern are formed by exposure to an electron beam. The orientation of the substrate and a path of the generally rectangular-shaped shot from the electron beam may be relatively altered such that the substrate is exposed to the electron beam to form the angled features as if they were non-angled features. In another exemplary embodiment, the electron beam lithography system determines whether it is necessary to relatively alter the orientation of the substrate and a path of the generally rectangular-shaped shot from the electron beam to form the angled features based on the number of angled features and the time required for relatively altering the orientation. Electron beam lithography systems employing a rotatable stage, rotatable apertures, or both, are also disclosed.

20 Claims, 8 Drawing Sheets

ELECTRON BEAM LITHOGRAPHY SYSTEM

CROSS-REFERENCE TO RELATED APPLICATION

This application is a divisional of U.S. patent application Ser. No. 10/824,279, filed Apr. 14, 2004, now U.S. Pat. No. 7,229,742, issued Jun. 12, 2007, the disclosure of which is hereby incorporated herein by this reference in its entirety.

BACKGROUND OF THE INVENTION

1. Field of the Invention

The present invention relates to the processing of substrates such as semiconductor wafers using electron beam lithography. More specifically, the present invention relates to methods for forming a mask pattern on a resist using electron beam lithography such that write time is reduced.

2. State of the Art

Semiconductor devices including integrated circuitry, such as memory dice, are mass produced by fabricating hundreds or even thousands of circuit patterns on a single semiconductor wafer or other bulk semiconductor substrate using lithographic processing in combination with various other processes. In order to increase the number of memory cells on semiconductor memory devices for a given surface area, it is important to accurately control the resolution of the images produced during lithography. These images are used to define structural features on a semiconductor substrate in fabricating the integrated circuitry of such semiconductor memory devices.

Photolithography is a process in which a pattern is delineated in a layer of material, such as a photoresist, sensitive to photons. In photolithography, an object containing a pattern (e.g., reticle or mask) is exposed to incident light. The image from the reticle or mask is projected onto a photoresist that covers a semiconductor wafer or other substrate. The photolithographic process typically involves exposing and developing the photoresist multiple times. At a given step, the photoresist is selectively exposed to photons and then developed to remove one of either the exposed or unexposed portions of photoresist, depending on whether a positive or negative photoresist is employed. Complex patterns typically require multiple exposure and development steps.

Currently, conventional photolithography using light is only capable of producing structural features of about 100 nm in minimum dimension. This inadequacy limits the ability of a manufacturer to produce extremely small structural features for integrated circuits through conventional photolithography processes. A capability to further reduce the dimensions of structural feature size is particularly important to the fabrication of semiconductor memory devices to enable an increase in the number of memory cells on such semiconductor memory devices of a given size.

In order to produce structural features smaller than the capability of photolithography, electron beam lithography (EBL) has been developed. EBL produces a desired pattern on a resist by irradiating a resist sensitive to electrons with an appropriate amount of electrons on specific portions of the resist. In a typical variable-shaped vector scan EBL process, the electron beam emitter is positioned over only specific sites of the resist and the resist is exposed to a shaped beam of electrons, called a shot. Positioning is accomplished by a combination of movement of the substrate stage in the X—Y direction in the plane of the substrate, and/or movement of the electron beam. Thus, the pattern data used by the EBL system must be provided with information that includes both the dose of electrons and the position of each site on the resist to be exposed for each shot.

Figure 1A:
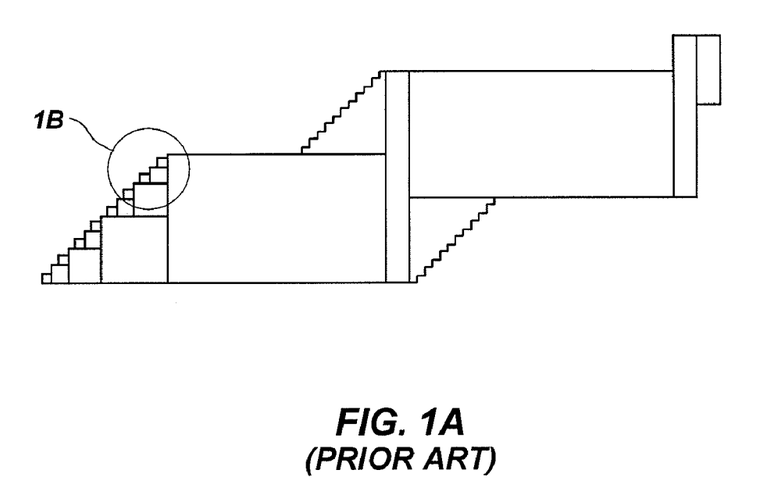
Figure 1B:
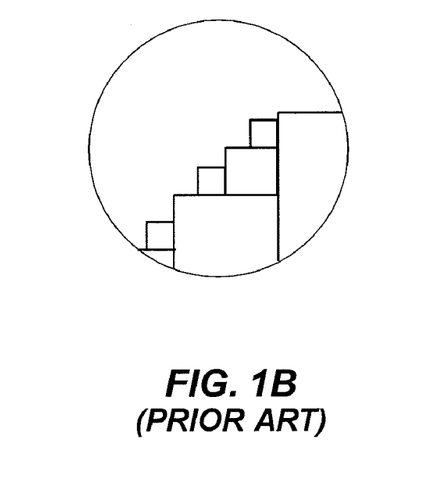
FIG. 1B is an enlarged depiction of the circled area of FIG. 1A.

The typical variable-shaped vector scan EBL process decomposes a pattern into rectangular-shaped or 45° angle triangular-shaped "primitives." The rectangles are aligned along the X—Y axes in the plane of the substrate defining the vector scan. The 45° angle triangular-shaped primitives are only capable of exposing features positioned at a 45° angle without using an excessive number of shots. The electron beam from the EBL system is capable of exposing a primitive in a single shot. As shown in FIGS. 1A and 1B, for a typical vector scan, a substantial portion of the pattern is made up of triangles approximated by various sizes of rectangles, while only a small portion of the pattern is made up of true rectangles. Because the write time is proportional to the number of shots, this use of small rectangles to approximate triangles requires a great number of shots and takes up to 90% of the exposure time. Furthermore, it results in loss of fidelity of the mask pattern produced on the resist as shown by the stepped edges in the triangular regions in FIGS. 1A and 1B.

Due to the long exposure times that are inherent in using small rectangles to approximate triangles, cell projected EBL may be used. In cell projected EBL, a variable-shaped electron beam, typically having the shape of the desired cell pattern or the shapes at various angles, is used to produce these non-rectangular shapes. The variable shape is produced by passing the electron beam through an aperture having the desired shape. When a variable-shaped beam is used, the pattern data used by the EBL system includes the dose of electrons, location, size, and shape for each shot. Although cell projected EBL reduces the write time required to expose a pattern, the total throughput is still undesirably too long. Also, it is difficult to prepare enough non-rectangular-shaped apertures to accommodate the multitude of patterns an integrated circuit designer may desire to use. Furthermore, using multiple apertures of varying shapes causes difficulties in the beam alignment and calibration of the EBL system. Examples of apparatus and methods for variable-shaped EBL are shown in U.S. Pat. No. 6,573,516 to Kawakami; U.S. Pat. No. 6,455,863 to Babin et al.; U.S. Pat. No. 6,259,106 to Boegli et al.; U.S. Pat. No. 5,760,410 to Matsuki et al.; and U.S. Pat. No. 4,532,598 to Shibayama et al.; each of the disclosures of which are herein incorporated by reference for all that they disclose.

Figure 2:
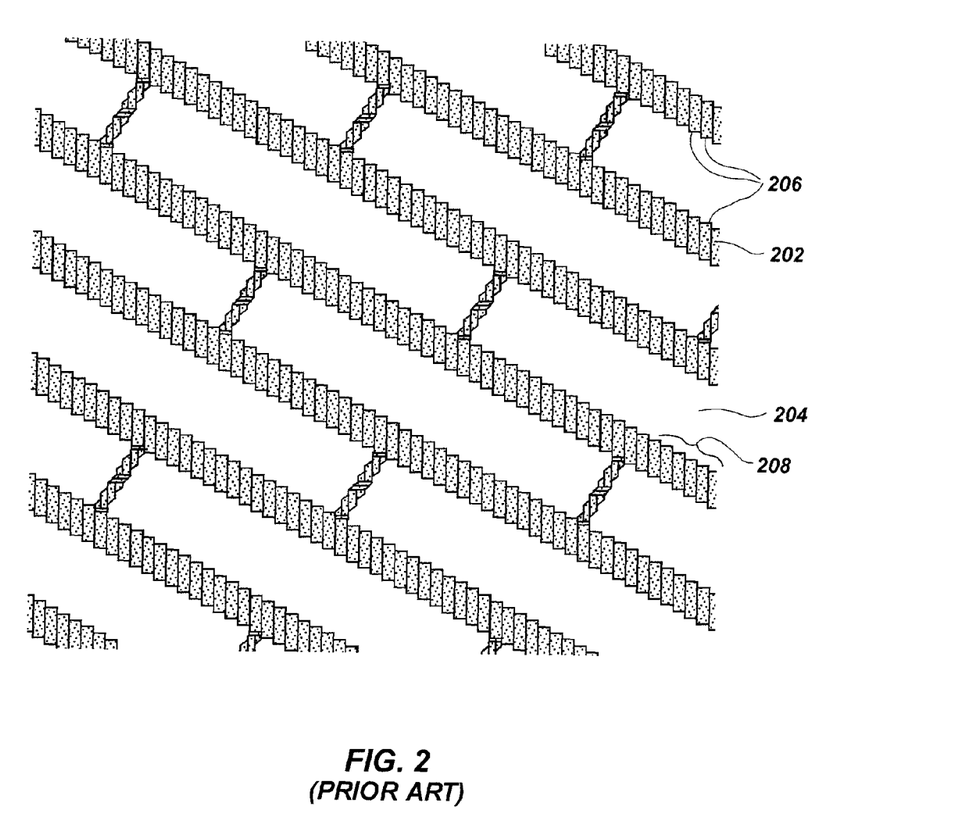
FIG. 2 illustrates a mask pattern having angled features processed using electron beam lithography.

The problem with write time is exacerbated by the new generation of integrated circuit designs that use "angled line" features, as shown by FIG. 2. In FIG. 2, the exposed regions 202 (dark) are the resist regions that have been exposed to the shots of an electron beam from an EBL system. The exposed regions 202 are made up of individual shots of primitive rectangles 206, which form the angled features on a resist 204. The exposed regions 202, otherwise known as the angled line features, are formed by using multiple stepped, or partially offset, rectangular shots. The exposed regions 202 exhibit a loss of fidelity as shown by the stepped edges 208 that form the angled features. The loss of fidelity in the mask pattern is an artifact of the processing because the exposed regions 202 would, ideally, exhibit smooth linear edges as represented by the design data for the integrated circuit layout. The lighter regions are the unexposed regions of resist 204. In order to increase the number of memory cells on semiconductor memory devices for a given surface area, integrated circuit designers lay out the features at a certain angle to maximize the use of the substrate surface area. However, this angled line layout makes it more expensive to generate the pattern on the resist 204 because of the numerous non-rectangular shapes that must be used to form the pattern, resulting in undesirably long write times and the great number of rectangular shots from the electron beam required to form the angled features.

Accordingly, a need exists to develop a method for generating angled features on resist using electron beam lithography wherein the write time is reduced compared to conventional EBL methods. Another need exists for a method to modify conventional EBL systems such that the method may be implemented by modification of a semiconductor manufacturer's existing equipment.

BRIEF SUMMARY OF THE INVENTION

The present invention, in a number of embodiments, includes electron beam lithography (EBL) systems and methods to shorten the write time required to produce mask patterns on a resist having angled features using EBL. The present invention may be used in EBL processing for fabrication of semiconductor devices, liquid crystal display (LCD) elements, thin-film magnetic heads, reticles, and for many other applications that require accurate mask pattern generation.

An exemplary EBL system is disclosed. The EBL system includes an electron gun capable of emitting an electron beam and at least one lens located for the electron beam to pass therethrough. The EBL system also includes a first aperture located for the electron beam to pass therethrough and at least one deflector for deflecting the electron beam through a second aperture to define a generally rectangular shape for an electron beam shot therethrough. A projection lens receives the electron beam from the second aperture to project the electron beam onto a substrate held by a movable stage. In an exemplary embodiment, the movable stage, the two apertures in combination, or both, may be rotatable with respect to one another and the position thereof accurately determined by a controller.

An exemplary embodiment for forming a mask pattern on a resist is also disclosed. The mask pattern to be formed includes at least one non-angled feature and at least one angled feature oriented at a predetermined angle relative to the non-angled feature. A substrate, such as a semiconductor wafer or a glass-based material, having a resist disposed thereon and located to receive an electron beam, is provided. The resist is then exposed using at least one generally rectangular-shaped shot from an electron beam to form at least one non-angled feature. A rotational orientation of the substrate and the generally rectangular shape of the electron beam shot may be relatively altered with respect to each other by the predetermined angle. Then, the resist is again exposed to at least one additional generally rectangular-shaped shot from the electron beam to form at least one angled feature, the angled feature having at least one linear, peripheral edge oriented at the predetermined angle relative to the non-angled feature. Thus, the angled features are exposed as if they were non-angled features using only generally rectangular-shaped electron beam shots. This reduces the total write time for forming the mask pattern and produces a mask pattern wherein the angled and non-angled features exhibit smooth edges.

Another exemplary embodiment for forming a mask pattern on a resist is disclosed. The mask pattern to be formed includes at least one non-angled feature and at least one angled feature oriented at a predetermined angle relative to the non-angled feature. A substrate, such as a semiconductor wafer or a glass-based material, having a resist disposed thereon and located to receive an electron beam is provided. An algorithm is used to determine whether the time required to form the at least one angled feature using multiple stepped or offset rectangular-shaped shots is greater than or less than the time required to relatively alter a rotational orientation of the substrate and the generally rectangular shape of the electron beam shot with respect to each other by the predetermined angle and subsequently form the at least one angled feature. The determination is based, in part, on the number of angled features, the number of shots required to form the angled feature, and the time required for relatively altering the rotational orientation of the substrate and the generally rectangular shape of the electron beam. If the time to alter the rotational orientation of the substrate and the generally rectangular shape of the electron beam shot relative to each other by the predetermined angle, plus form the angled features is greater, the mask pattern is formed by exposing the at least one angled feature and the at least one non-angled feature, without relatively altering the orientation of the substrate and the generally rectangular shape of the electron beam shot, using generally rectangular-shaped shots from an electron beam. If the algorithm determines that it is more time efficient, the at least one non-angled feature is exposed using at least one generally rectangular-shaped shot from an electron beam, followed by relatively altering a rotational orientation of the substrate and the generally rectangular shape of the electron beam shot with respect to each other by the predetermined angle and subsequent exposing of the at least one angled feature, using at least one generally rectangular-shaped shot from an electron beam. The above exemplary embodiment enables optimization of the write time for forming mask patterns. If the substrate and the generally rectangular shape of the electron beam shot are reoriented with respect to each other by the predetermined angle to form the angled features, the angled features are exposed as if they were non-angled features, using only generally rectangular-shaped electron beam shots. Furthermore, this reduces the total write time for forming the mask pattern and produces a mask pattern wherein the angled and non-angled features exhibit smooth edges.

These features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention:

FIGS. 1A and 1B are illustrations of the use of rectangular-shaped primitives to form the triangular portions of a mask pattern using conventional electron beam lithography.

DETAILED DESCRIPTION OF THE INVENTION

The present invention, in a number of embodiments, includes electron beam lithography (EBL) systems and methods to shorten the write time required to produce mask patterns on a resist having angled features using EBL. The present invention may be used in EBL processing for fabrication of semiconductor devices, liquid crystal display elements, thin-film magnetic heads, reticles, and for many other applications that require accurate mask pattern generation. In the drawings, like numerals describe substantially similar components throughout several views.

The present invention employs commercially available EBL systems that are modified to include a stage rotatable about an axis perpendicular to the stage, rotatable apertures, or both. For instance, commercially available variable-shaped electron beam, vector scan EBL systems, such as the NUFLARE® Technology EBM4000 system and the JEOL JBX-9000 system may be modified to successfully practice the methods of the present invention.

Figure 3A:
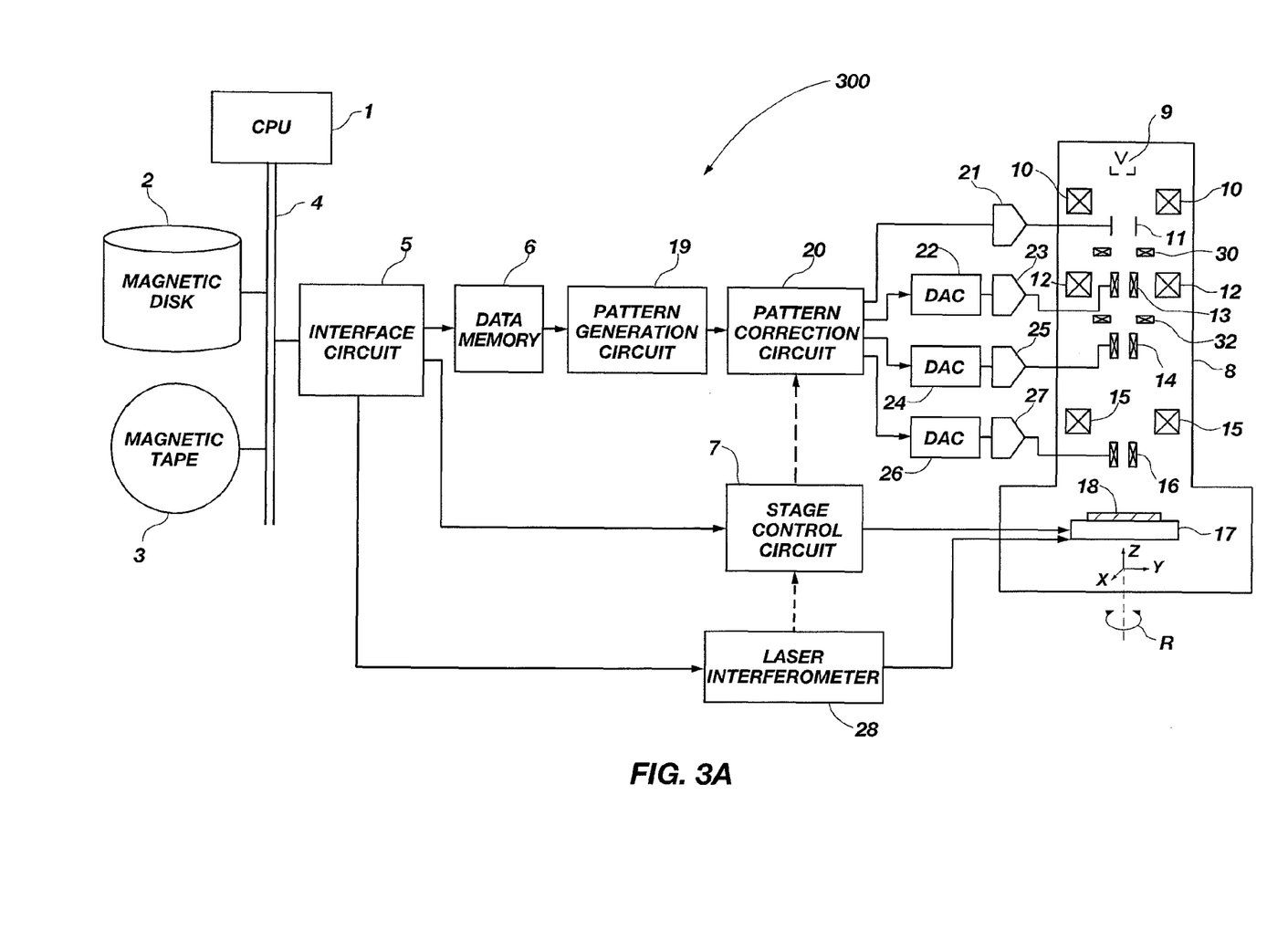
FIGS. 3A and 3B illustrate exemplary electron beam lithography systems of the present invention that may be used to implement the methods of the present invention.

FIG. 3A shows the configuration of an exemplary electron-beam lithography system 300 that may be used to practice the present invention. FIG. 3 discloses a processor 1, a magnetic disk 2, and a magnetic tape drive 3. These units are interconnected over a bus 4, and connected to a data memory 6 and stage control circuit 7 via an interface circuit 5 over the bus 4. A housing (column) 8 accommodates an electron gun 9, a lens 10, a blanking electrode 11, a first aperture 30, a lens 12, a shaping deflector coil 13, a second aperture 32, a sub-deflector coil 14, a lens 15, a main deflector coil 16, a stage 17, and a substrate 18. The first aperture 30 and the second aperture 32 may be termed, collectively, an apparatus for defining a shape for the electron beam shots from the electron gun 9 therethrough. The substrate 18 is placed on the stage 17. The stage 17 may be moved in the X and Y directions defining the plane of the stage 17 and rotated as shown by arrow R about a Z-axis that is substantially perpendicular to the surface of the stage 17 (illustrated by the X—Y-Z coordinate system in FIG. 3A) according to an output signal of the stage control circuit 7. The position of stage 17, whether translated in the plane of the stage 17 or rotated about a Z-axis perpendicular to the surface of the stage 17, may be accurately determined by a laser interferometer 28. Laser interferometer 28 may be in communication with the stage control circuit 7, such that the positional information of the stage 17, as determined by the laser interferometer 28, may be sent to the stage control circuit 7.

Figure 3B:
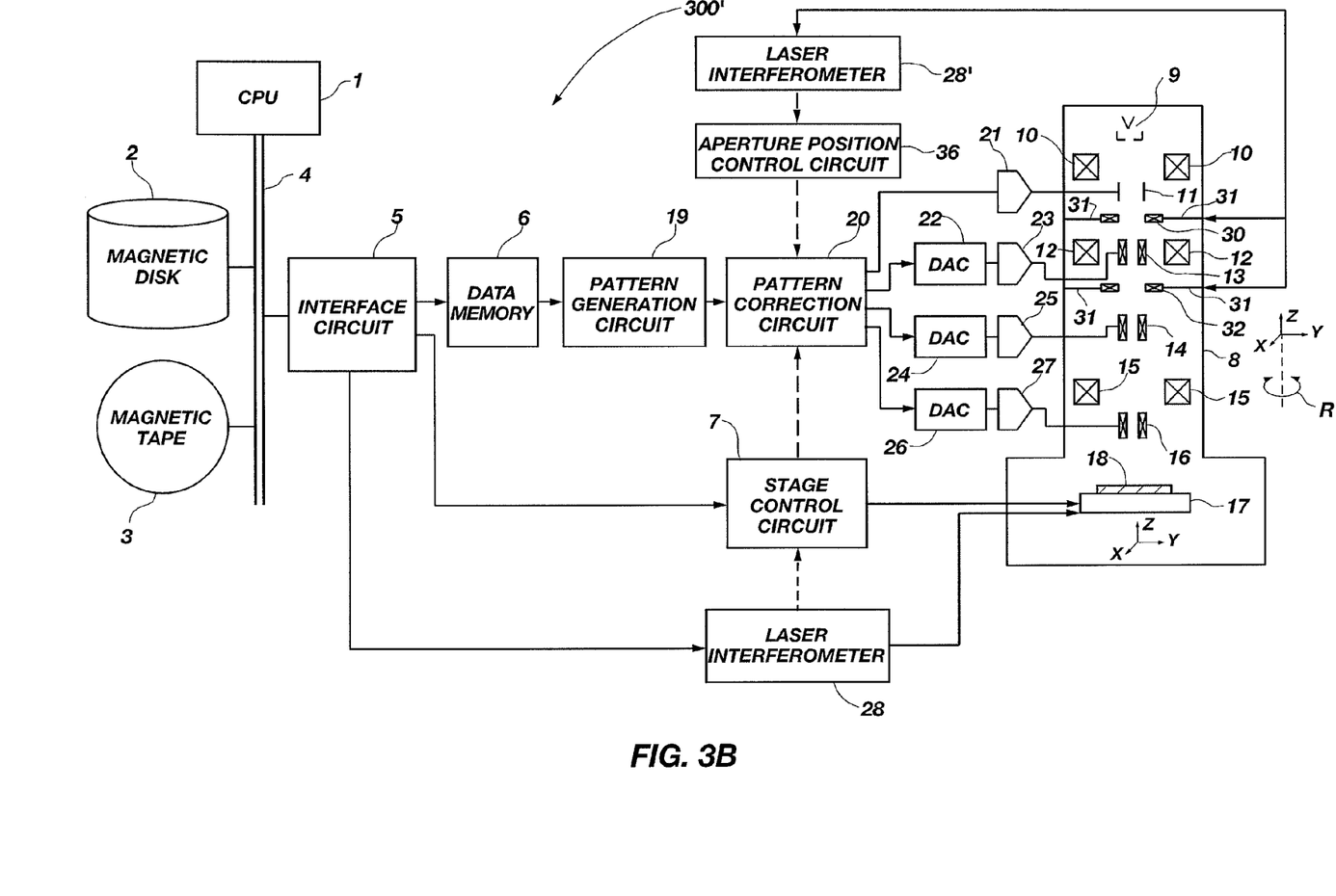

Referring to FIG. 3B, another exemplary EBL system 300' is illustrated wherein the first aperture 30 and the second aperture 32 comprise an apparatus that may be angularly rotated in combination as shown by arrow R about a Z-axis that is coaxial with the electron beam. The rotation of the first aperture 30 and the second aperture 32 may be accurately controlled by a rotation mechanism 31. The rotation mechanism 31 may include an aperture support (not shown) that holds the first aperture 30 and the second aperture 32 and a drive to initiate and control rotation thereof. The drive may include reduction gearing for extremely precise rotation over a selected arc. The aperture support may be fixed to the housing 8. The first aperture 30 and the second aperture 32 are rotated by the same angle such that the alignment of the apertures 30, 32 with respect to one another is not altered after the rotation thereof. The rotational position of the first aperture 30 and the second aperture 32 may be determined by a laser interferometer 28' that communicates the positional information to an aperture position control circuit 36. The drive may, alternatively, be a rotary stepper motor or include a rotary encoder for accurate determination of the positional information of the first aperture 30 and the second aperture 32 to be communicated to the aperture position control circuit 36.

Data read from the data memory 6 is supplied to a pattern correction circuit 20 via a pattern generation circuit 19. The pattern correction circuit 20 applies a blanking signal to the blanking electrode 11 via an amplifier 21. Moreover, the pattern correction circuit 20 applies a signal to the deflector coils 13, 14, and 16 via digital-to-analog converters (DAC) 22, 24, and 26, and amplifiers 23, 25, and 27.

Again, with continued reference to FIGS. 3A and 3B, the operation of EBL systems 300 and 300' are described. An electron beam emitted from the electron gun 9 passes through the lens 10. The electron beam is then transmitted or intercepted by the blanking electrode 11, and reshaped into a rectangular beam of parallel rays having any spot size of, for example, 3 μm or less by passing through a rectangular-shaped first aperture 30. After passing through the first aperture 30, the shaping deflector coil 13 deflects the electron beam having a generally rectangular shape to overlap a portion of the second aperture 32 to form a smaller generally rectangular-shaped electron beam. This enables forming a variable-shaped electron beam depending on the amount of overlap of the electron beam deflected by shaping deflector coil 13 and the second aperture 32. Differently shaped or additional apertures may be used in. EBL system 300 and 300' to produce an angled shape, such as a 45° triangle, in addition to rectangular or square shapes. The sub-deflector coil 14 and main deflector coil 16 deflect the electron beam onto the specific portions of the substrate 18 desired to be exposed to the electron beam by use of the deflector coils 13, 14, 16 and/or the movement of stage 17.

The electron beam is then converged on the surface of the substrate 18 through the projection lens 15. Areas where shaping deflector coil 13, sub-deflector coil 14, and main deflector coil 16 can deflect the beam get larger in that order. Specifically, the area where the shaping deflector coil 13 can deflect the beam is smaller than that where the sub-deflector coil 14 can. The area where the sub-deflector coil 14 can deflect the beam is smaller than area that the main deflector coil 16 can. For ensuring a large area where the beam can be deflected, the number of windings of a coil must be increased accordingly. The response speeds of the coils get lower in reverse order. In other words, a settlement wait time required by the shaping deflector coil 13 is the shortest. Settlement wait times required by the sub-deflector coil 14 and main deflector coil 16 get longer in that order. A more detailed explanation is given by each of the aforementioned U.S. Pat. No. 6,573,516 to Kawakami; U.S. Pat. No. 6,455,863 to Babin et al.; U.S. Pat. No. 6,259,106 to Boegli et al.; U.S. Pat. No. 5,760,410 to Matsuki et al.; and U.S. Pat. No. 4,532,598 to Shibayama et al.; the disclosures of each of which are incorporated herein by reference.

Figure 4:
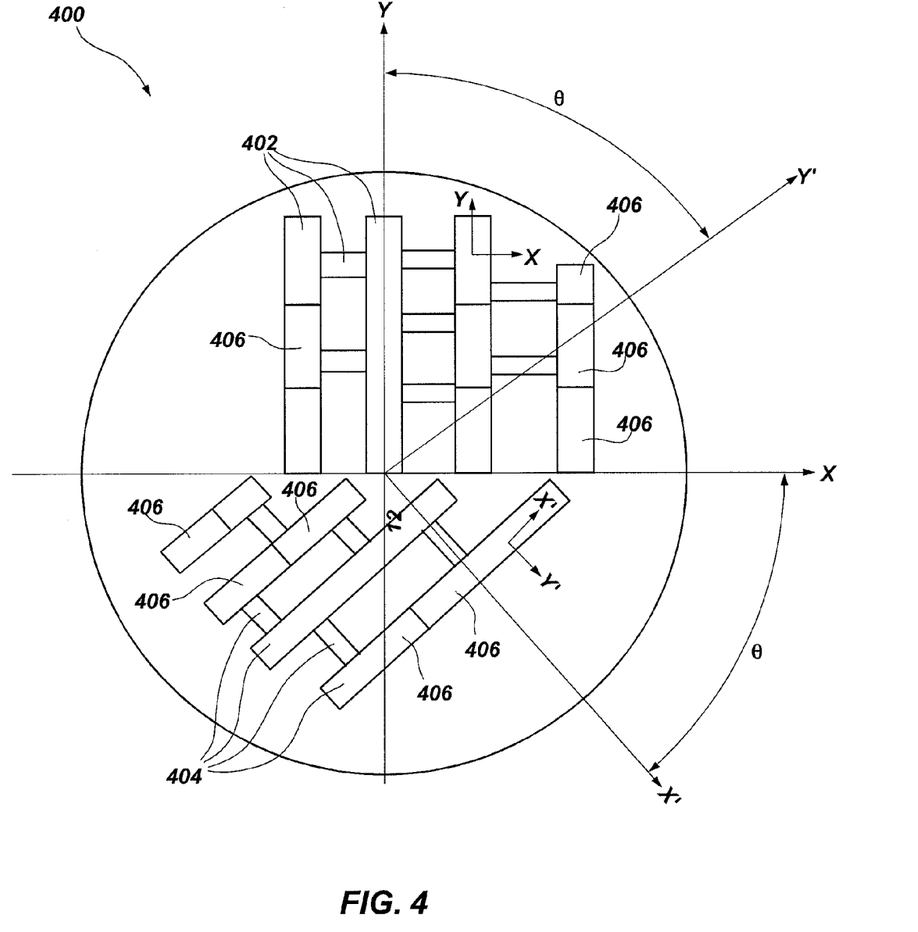
FIG. 4 illustrates a portion of a mask pattern of a simplified integrated circuit layout containing angled and non-angled features.

FIG. 4 illustrates a simplified portion 400 of a mask pattern to be formed on a resist disposed on a substrate having a first coordinate system defined by an X reference axis and a Y reference axis, and a second coordinate system defined by an X' reference axis and a Y' reference axis, wherein the two coordinate systems are oriented at an angle θ relative to each other. Portion 400 contains non-angled features 402 shown, for clarity, with the X and the Y reference axes translated onto it. Portion 400 also contains angled features 404 shown, for clarity, with the X' and the Y' reference axes translated onto it.

The angled features 404 are oriented by an angle θ relative to the non-angled features 402. The non-angled features 402 and angled features 404 may be comprised of primitive shapes such as rectangles 406. The primitive shapes, such as rectangles 406, which form the angled features 404, do not exhibit a stepped or offset geometry as shown in FIG. 2 of the prior art. Instead, the sides of multiple rectangles 406 are abutted to and aligned with adjacent rectangles 406 to form a larger contiguous angled feature 404. The rectangles 406 used to form the non-angled features 402 each have an edge generally parallel to the X-axis and an edge generally parallel to the Y-axis. Similarly, the rectangles 406 used to form the angled features 404 each have an edge generally parallel to the X'-axis and an edge generally parallel to the Y'-axis. During EBL processing of a resist to form the mask pattern, which will be discussed in more detail below, the non-angled features 402 and the angled features 404 are formed on a resist by exposing the resist to shots from the electron beam, wherein the shape, size, and orientation of the electron beam corresponds to the shape, size, and orientation of each rectangle 406 of the mask pattern.

Figure 5:
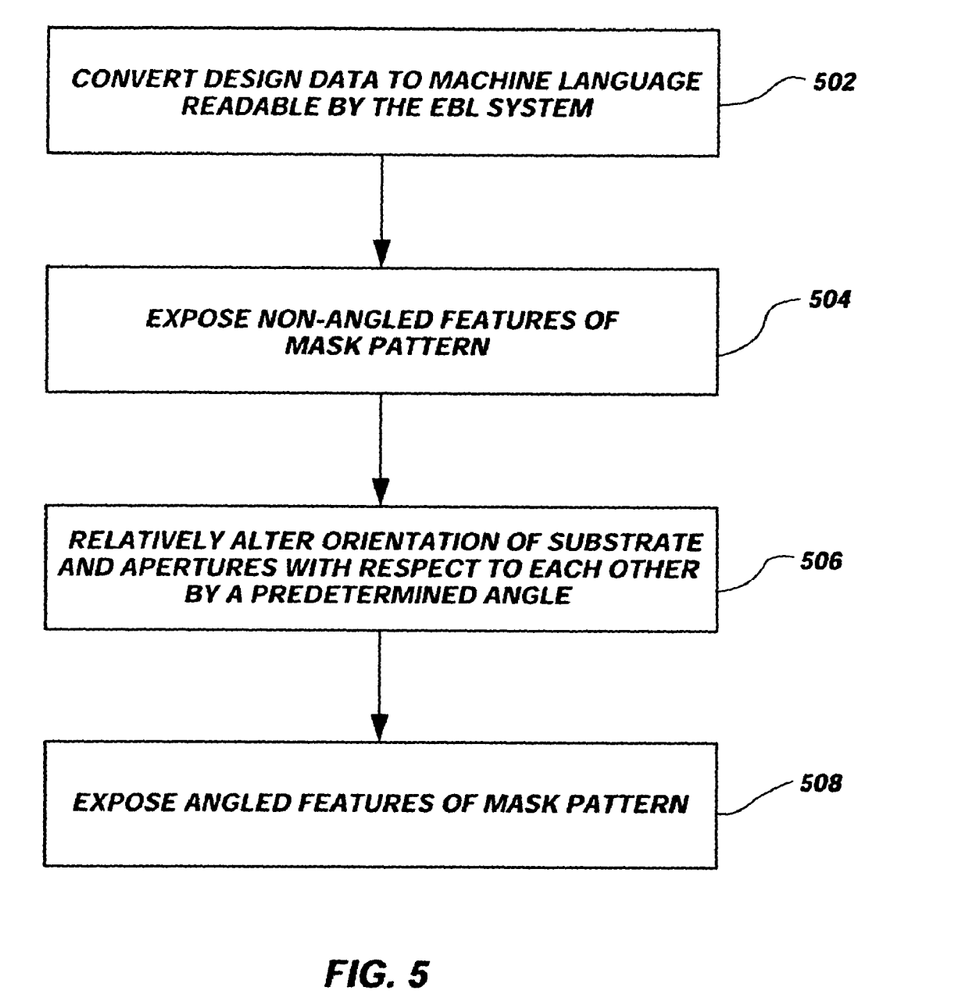
FIG. 5 is a process flow diagram of an exemplary embodiment of the present invention.

An exemplary method that utilizes the EBL systems 300 or 300' shown in FIGS. 3A and 3B is described with reference to FIG. 4 and the process flow diagram of FIG. 5. The design data for a particular integrated circuit may be stored in a magnetic storage medium or other suitable storage device that may be coupled to the processor that controls the EBL system 300 or 300'. Typically, the design data contains both non-angled features and angled features that comprise the electronic devices or components of the integrated circuit. An EBL system 300 or 300' is provided with a movable stage 17 supporting a substrate 18 made from a semiconductor material such as a silicon wafer or a gallium arsenide wafer, or a glass material useful for forming a photomask or reticle. Substrate 18 includes a layer of resist material on the surface that may be exposed to the electron beam of the EBL system. Suitable positive EBL resist materials include FEP-171, commercially available from Fuji-Film Arch, PEK-130, commercially available from Sumitomo Chemical, and ZEP7000, commercially available from Zeon Corporation. Suitable negative EBL resists include FEN-270, commercially available from Fuji-Film Arch, and NEB-22, commercially available from Sumitomo Chemical.

In act 502, the design data may be converted to the machine language used by the particular EBL system. If the design data contains non-angled features, in act 504 the non-angled features 402 may be formed by exposing the resist to an electron beam shot-by-shot using generally rectangular-shaped shots from the EBL system.

Following exposing of the non-angled features 402 in act 506, the rotational orientations of the stage 17 supporting the substrate 18 and the first aperture 30 and the second aperture 32, may be relatively altered with respect to each other by a predetermined angle. In an exemplary embodiment, the stage 17 supporting the substrate 18 may be rotated by an angle θ about a Z-axis that is perpendicular to the surface of substrate 18 while the first aperture 30 and the second aperture 32 remain stationary. In another exemplary embodiment, the first aperture 30 and the second aperture 32 may be rotated by an angle θ about a Z-axis that is perpendicular to the surface of substrate 18 while the substrate 18 remains stationary. The rotation of stage 17 may be controlled by the laser interferometer 28 operably coupled to the stage control circuit 7 and the processor 1 to accurately control and measure the rotation of stage 17. If the first aperture 30 and the second aperture 32 are rotated, the rotation may be similarly controlled by the laser interferometer 28' operably coupled to the aperture position control circuit 36 to accurately control and measure the position thereof, or a stepper motor or rotary encoder may be employed. In act 508, the angled features 404 may then be formed by exposing the resist to an electron beam shot-by-shot using generally rectangular-shaped shots from the EBL system. Since the substrate 18 or the first aperture 30 and the second aperture 32 have been rotated, the angled features 404 are exposed on the resist by the EBL system as if they were non-angled features.

Figure 6:
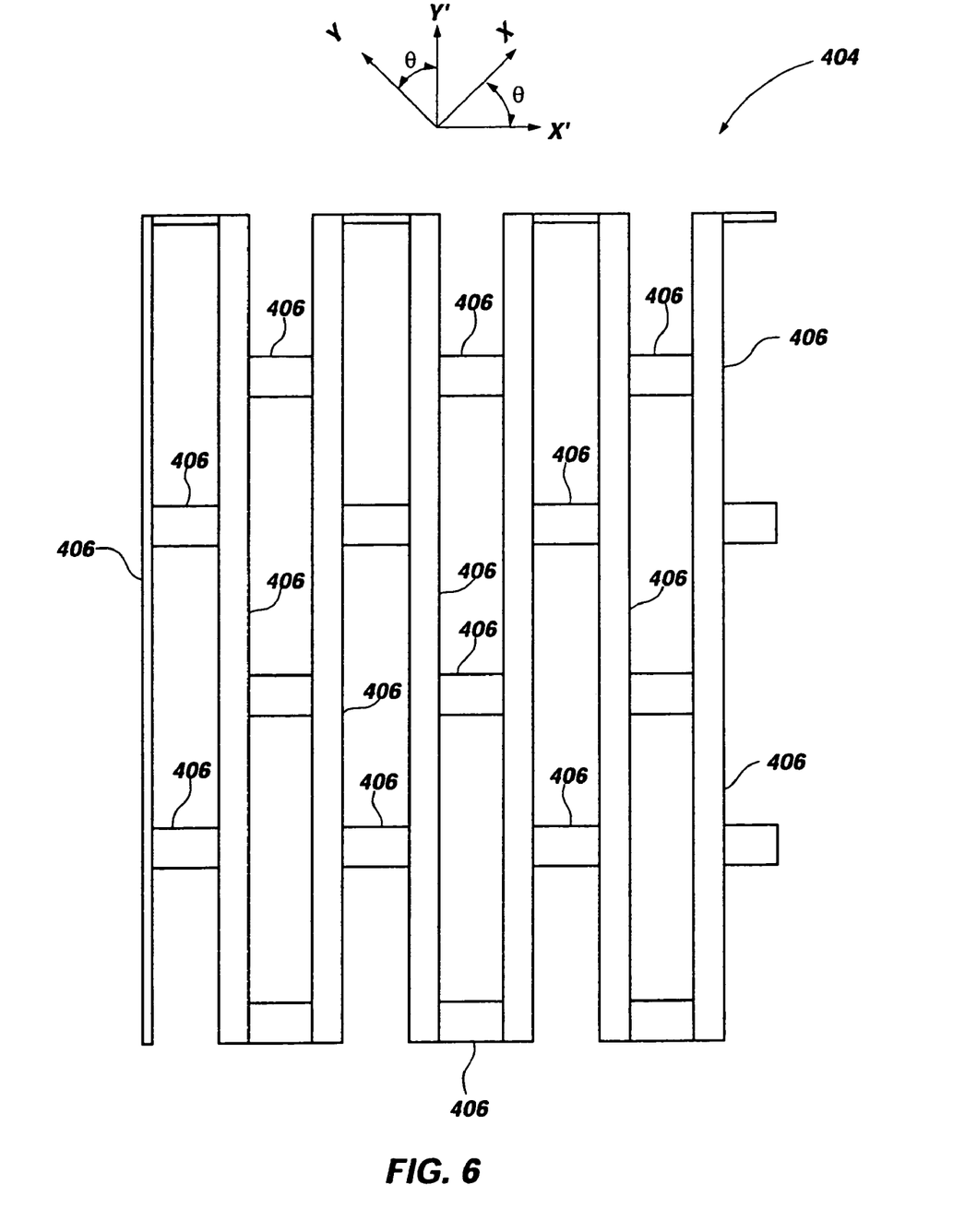
FIG. 6 illustrates the angled features of a mask pattern formed by the electron beam lithography method of the present invention.

Thus, the angled features 404 may be written out using only generally rectangular-shaped shots. The shots may be larger and there are no triangular regions that must be composed of multiple rectangular shots. Therefore, the number of shots required to produce angled features of the mask pattern is reduced, resulting in a shorter write time. Furthermore, the multiple shots from the electron beam do not exhibit a stepped, or offset, geometry. Instead, the sides of multiple rectangular shots are abutted to and aligned with the adjacent rectangular shots to form a larger contiguous angled feature 404 comprising the mask pattern. Due to the forming of a contiguous angled feature 404, the angled features 404 do not exhibit the loss of fidelity that was so apparent in FIG. 2 of the prior art. Rather, the angled features 404 exhibit well-defined, linear boundaries that make up their edges as shown in FIG. 6. If a negative resist is used, the unexposed regions of the resist may be removed leaving the desired mask on the substrate. If a positive resist is used, the exposed regions may be removed leaving the desired mask on the substrate. Such developing of the resist may be performed using standard techniques known in the art, such as subjecting the resist to a solvent.

Figure 7:
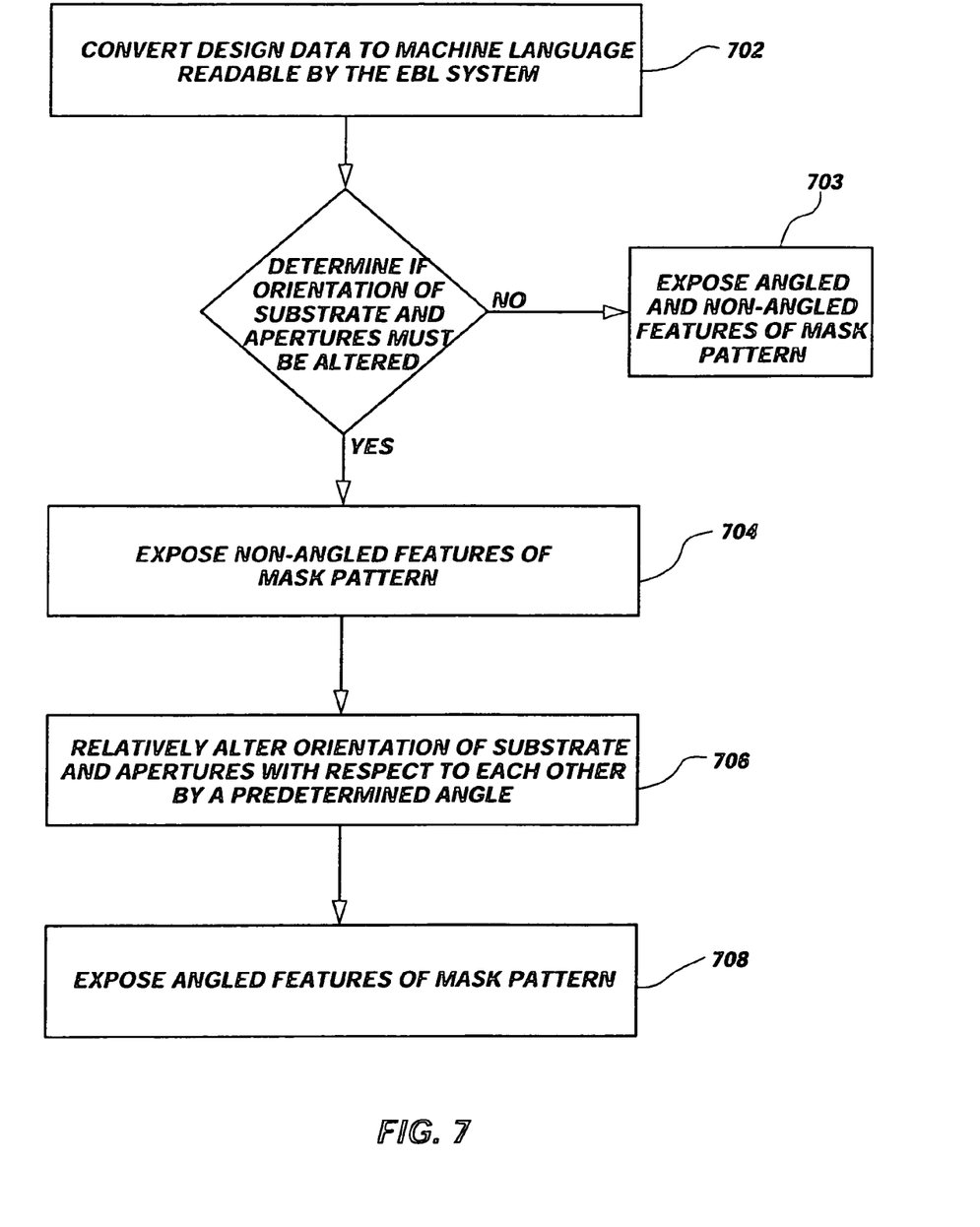
FIG. 7 is a process flow diagram of another exemplary embodiment of the present invention.

Referring to the process flow diagram of FIG. 7 in another exemplary embodiment, the orientation of the stage 17 supporting the substrate 18 and the first aperture 30 and the second aperture 32 may or may not be relatively rotated with respect to each other by a predetermined angle in order to minimize the write time of the mask pattern. In act 702, the design data may be converted to the machine language used by the particular EBL system. The central processing unit of the computer that controls the EBL system determines, using a programmed algorithm, whether the time required to expose the angled features 404 using multiple stepped rectangular shots (as shown in FIG. 2) is greater than or less than the time required to rotate the stage 17 or the first aperture 30 and the second aperture 32 by an angle θ and subsequently form the angled features 404. The determination may be based, in part, on the number of angled features 404, the number of shots required to form the angled features 404, and the time required for rotating the stage 17 or the first aperture 30 and the second aperture 32. If the EBL system determines that the write time to form the mask pattern is shorter if the angled features 404 are exposed on the resist without rotating the stage 17 or the first aperture 30 and the second aperture 32, then the stage 17 or the first aperture 30 and the second aperture 32 are not rotated. In such a case, in act 703, the angled and non-angled features 404, 402, respectively, are formed by exposing the resist to an electron beam shot-by-shot using generally rectangular-shaped shots from the EBL system without rotating the stage 17 or the first aperture 30 and the second aperture 32. Thus, the angled features are exposed using multiple stepped or offset generally rectangular-shaped shots forming the angled features as shown in FIG. 2.

If the programmed algorithm determines that the stage 17 or the first aperture 30 and the second aperture 32 must be rotated to minimize the write time for producing the particular mask pattern, in act 704, the non-angled features 402 may be formed by exposing the resist to an electron beam shotby-shot using generally rectangular-shaped shots from the EBL system. In an exemplary embodiment, following exposing of the non-angled features 402, in act 706, the stage 17 supporting the substrate 18 may be rotated by an angle θ about a Z-axis that is perpendicular to the surface of substrate 18, while the first aperture 30 and the second aperture 32 remain stationary. In another exemplary embodiment, following exposing of the non-angled features 402, in act 706, the first aperture 30 and the second aperture 32 may be rotated by an angle θ about a Z-axis that is perpendicular to the surface of substrate 18 while the substrate 18 remains stationary. Control of the rotation angle is effected in the same manner as in the previous embodiment, using the laser interferometer 28 or 28'. In act 708, the angled features 404 may be exposed by the EBL system. Since the substrate 18 or the first aperture 30 and the second aperture 32 have been rotated, the angled features 404 are exposed by the EBL system using generally rectangular-shaped shots as if they were non-angled features having all of the benefits of the previous embodiment, such as, reduced write time, and well defined, linear boundaries that make up the angled features 404 edges. If a negative resist is used, the unexposed regions of the resist may be removed leaving the desired mask on the substrate. If a positive resist is used, the exposed regions may be removed leaving the desired mask on the substrate. Such developing of the resist may be performed using standard techniques known in the art, such as subjecting the resist to a solvent.

Although the foregoing description contains many specifics, these are not to be construed as limiting the scope of the present invention, but merely as providing certain exemplary embodiments. Similarly, other embodiments of the invention may be devised that do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed is:

1. An electron beam lithography system, comprising:
   an electron emitter for emitting an electron beam;
   at least one lens spaced apart from the electron emitter and located coaxially for the electron beam to pass therethrough;
   first aperture and a second aperture for defining a generally rectangular shape of the electron beam passed therethrough;
   at least one deflector for varying a path of the generally rectangular-shaped electron beam toward the second aperture;
   a projection lens located to receive the electron beam from the second aperture for defining the shape of the electron beam passed therethrough; and
   a stage configured to support a substrate and located in the path of the generally rectangular-shaped electron beam, wherein the stage is configured to alter a rotational orientation of the substrate relative to the path of the generally rectangular-shaped electron beam by a predetermined angle to form a first feature and a second feature having at least one linear, peripheral edge substantially oriented at the predetermined angle relative to the first feature.

2. The electron beam lithography system of claim 1, wherein the stage is rotatable and operably coupled to a controller for controlling at least a relative rotational position of the stage.

3. The electron beam lithography system of claim 2, further comprising a laser interferometer for determining the at least the relative rotational position of the stage.

4. The electron beam lithography system of claim 2, wherein the stage is rotatable about an axis substantially perpendicular to a plane of the stage.

5. The electron beam lithography system of claim 4, wherein the stage is translatable in the plane of the stage.

6. The electron beam lithography system of claim 1, wherein the first aperture and the second aperture for defining the generally rectangular shape of the electron beam passed therethrough are rotatable and operably coupled to a controller for controlling a relative rotational position thereof.

7. The electron beam lithography system of claim 6, further comprising a laser interferometer or a rotary encoder for determining the at least the relative rotational position of at least one of the first aperture and the second aperture for defining the generally rectangular shape of the electron beam passed therethrough.

8. The electron beam lithography system of claim 6, further comprising a drive for effecting the relative rotational position of at least one of the first aperture and the second aperture for defining the generally rectangular shape of the electron beam passed therethrough.

9. The electron beam lithography system of claim 2, wherein at least one of the first aperture and the second aperture for defining the generally rectangular shape of the electron beam passed therethrough is rotatable and operably coupled to the controller for controlling at least the relative rotational position thereof.

10. The electron beam lithography system of claim 9, further comprising a laser interferometer or a rotary encoder for determining the at least the relative rotational position of at least one of the first aperture and the second aperture for defining the generally rectangular shape of the electron beam passed therethrough.

11. The electron beam lithography system of claim 10, further comprising a drive for effecting the at the relative rotational position of the at least one of the first aperture and the second aperture for defining the generally rectangular shape of the electron beam passed therethrough.

12. An electron beam lithography system, comprising:
   an electron emitter for emitting an electron beam;
   at least one lens located in a path of the electron beam;
   an aperture located in the path of the electron beam;
   another aperture sized and configured to define a shape for the electron beam as directed therethrough;
   at least one deflector for deflecting the electron beam through the another aperture; and
   movable stage configured to alter a rotational orientation of a substrate relative to the path of the electron beam by a predetermined angle to form a first feature and a second feature having at least one linear, peripheral edge substantially oriented at the predetermined angle relative to the first feature.

13. The electron beam lithography system of claim 12, further comprising a projection lens configured to receive the electron beam after passage through the another aperture and to project the electron beam onto the substrate.

14. The electron beam lithography system of claim 13, wherein at least one of the movable stage, the aperture, and the another aperture are rotatable with respect to one another.

15. The electron beam lithography system of claim 12, wherein the at least one deflector is positioned to deflect the electron beam to overlap with a portion of the another aperture.

16. The electron beam lithography system of claim 12, wherein the at least one deflector is positioned to deflect the electron beam through the another aperture to form a smaller, generally rectangular-shaped electron beam.

17. The electron beam lithography system of claim 12, further comprising a rotation mechanism for angularly rotating the first aperture and the second aperture about an axis coaxial with the electron beam.

18. An electron beam lithography system, comprising:
   an electron gun configured to emit an electron beam;
   an apparatus for defining a shape of the electron beam;
   movable stage configured to support a substrate and located in a path of the electron beam; and
   a controller coupled to at least one of the rotatable apparatus and the movable stage and configured for determining a first rotational orientation of the substrate relative to the apparatus to form at least one non-angled feature and for determining a second rotational orientation of the substrate relative to the apparatus to form at least one angled feature having at least one linear, peripheral edge substantially oriented at a predetermined angle relative to the at least one non-angled feature.

19. The electron beam lithography system of claim 18, further wherein the controller comprises a laser interferometer for determining the first rotational orientation and the second rotational orientation.

20. The electron beam lithography system of claim 18, further comprising a drive for effecting rotation of the apparatus for defining the shape of the electron beam therethrough.

* * * * *